United States Patent
Pedersen

(10) Patent No.: US 9,360,522 B2
(45) Date of Patent: *Jun. 7, 2016

(54) METHODS AND APPARATUS FOR AUTOMATIC FAULT DETECTION

(71) Applicant: Altera Corporation, San Jose, CA (US)

(72) Inventor: Bruce B. Pedersen, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/990,735

(22) Filed: Jan. 7, 2016

(65) Prior Publication Data

US 2016/0116536 A1 Apr. 28, 2016

Related U.S. Application Data

(63) Continuation of application No. 13/405,781, filed on Feb. 27, 2012, now Pat. No. 9,235,460.

(51) Int. Cl.
| | |
|---|---|
| G01R 27/28 | (2006.01) |
| G01R 31/3177 | (2006.01) |
| G06F 11/07 | (2006.01) |
| G11C 29/56 | (2006.01) |
| G01R 31/3187 | (2006.01) |

(Continued)

(52) U.S. Cl.
CPC ........ *G01R 31/3177* (2013.01); *G01R 31/3187* (2013.01); *G01R 31/31724* (2013.01); *G01R 31/3275* (2013.01); *G06F 11/0751* (2013.01); *G11C 29/56* (2013.01)

(58) Field of Classification Search
CPC .............. G06F 11/0751; G01R 31/31724; G01R 31/3275; G01R 31/3187; G11C 29/56
USPC ........................................................ 702/117
See application file for complete search history.

(56) References Cited

U.S. PATENT DOCUMENTS 5,250,909 A   10/1993   Bitts
5,694,401 A * 12/1997   Gibson .......... G01R 31/318385
                                              714/30

(Continued)

FOREIGN PATENT DOCUMENTS

| CN | 103294048 A | 9/2013 |
|---|---|---|
| EP | 1089084 A1 | 4/2001 |
| EP | 1351065 A1 | 10/2003 |

OTHER PUBLICATIONS

"U.S. Appl. No. 13/405,781, Advisory Action mailed Apr. 23, 2015", 3 pgs.

(Continued)

*Primary Examiner* — John Breene
*Assistant Examiner* — Eyob Hagos

(57) ABSTRACT

Techniques and mechanisms are provided to monitor signals including critical signals at the endpoints, or leaves, of one or more signal trees in an integrated circuit device. Sensors or layers of sensors may be configured in fault detection circuitry to monitor signals and compare them to static or dynamically varying values. The fault detection circuits may include OR-gate daisy chains that output a fault detection signal to control circuitry if any signal at a particular leaf deviates from an expected signal. Fault detection circuits may also be configured to identify instances where two or more or N or more signals deviate from an expected signal. Mechanisms may also be provided to assure the reliability of fault detection circuitry itself.

20 Claims, 6 Drawing Sheets

(51) Int. Cl.
*G01R 31/327* (2006.01)
*G01R 31/317* (2006.01)

(56) References Cited

U.S. PATENT DOCUMENTS

| | | | |
|---|---|---|---|
| 6,115,312 A | 9/2000 | Jefferson et al. | |
| 6,344,755 B1 | 2/2002 | Reddy et al. | |
| 6,574,761 B1 | 6/2003 | Abramovici et al. | |
| 6,815,982 B2 | 11/2004 | Buhr | |
| 6,864,710 B1 | 3/2005 | Lacey et al. | |
| 6,973,600 B2 | 12/2005 | Lau et al. | |
| 7,131,043 B1 | 10/2006 | Dastidar | |
| 7,310,757 B2 | 12/2007 | Ngo et al. | |
| 7,710,147 B1 | 5/2010 | White et al. | |
| 8,378,710 B1 | 2/2013 | Al-Kadi et al. | |
| 2002/0011827 A1* | 1/2002 | Ishida | G01R 31/318342 324/71.5 |
| 2003/0172334 A1* | 9/2003 | Hartano | G01R 31/31705 714/729 |
| 2003/0221151 A1 | 11/2003 | Agarwal | |
| 2003/0229838 A1* | 12/2003 | Hiraide | G01R 31/318547 714/738 |
| 2006/0168483 A1 | 7/2006 | Sherlock et al. | |
| 2006/0208785 A1 | 9/2006 | Lee et al. | |
| 2007/0277085 A1* | 11/2007 | Goessel | G06F 11/1016 714/824 |
| 2008/0162969 A1 | 7/2008 | Royannez et al. | |
| 2008/0244346 A1 | 10/2008 | Poehl et al. | |
| 2008/0244364 A1 | 10/2008 | Shieh et al. | |
| 2011/0099459 A1* | 4/2011 | Nakamura | G06F 11/1048 714/763 |
| 2011/0149453 A1* | 6/2011 | Kamor | H01H 71/125 361/62 |
| 2012/0221919 A1* | 8/2012 | Ekas | G06F 11/1048 714/758 |
| 2013/0226498 A1 | 8/2013 | Pedersen | |

OTHER PUBLICATIONS

"U.S. Appl. No. 13/405,781, Examiner Interview Summary mailed Sep. 21, 2015", 1 pg.

"U.S. Appl. No. 13/405,781, Examiner Interview Summary mailed Oct. 30, 2014", 3 pgs.

"U.S. Appl. No. 13/405,781, Final Office Action mailed Feb. 12, 2015", 15 pgs.

"U.S. Appl. No. 13/405,781, Non Final Office Action mailed Jun. 2, 2015", 15 pgs.

"U.S. Appl. No. 13/405,781, Non Final Office Action mailed Jul. 25, 2014", 14 pgs.

"U.S. Appl. No. 13/405,781, Notice of Allowance mailed Sep. 21, 2015", 10 pgs.

"U.S. Appl. No. 13/919,968, Examiner Interview Summary mailed May 6, 2015", 3 pgs.

"European Application Serial No. 13155874.4, Extended European Search Report mailed Jul. 4, 2013", 11 pgs.

"European Application Serial No. 13155874.4, Office Action mailed Oct. 1, 2015", 6 pgs.

Kumar, L. K. et al., "Pseudo-online testing methodologies for various components of field programmable gate arrays", Microprocessors and Microsystems, IPS Business Press LTD. London, GB vol. 29 No. 2-3, Jul. 21, 2004, 99-119.

Masakatsu, Nishigaki et al., "A Fault Tolerant Combinational Circuit with Fault Diagnosis Capability—To Mask and Detect the Loss of Any One Connection between Gate Circuits", Systems & Computers in Japan, Wiley, Hoboken, NJ, vol. 34, No. 11, XP001178348, ISSN: 0882-1666, DOI: 10.1002/SCJ.10081, Oct. 1, 2003, 67-80.

Mclean, Mark, "FPGA-Based Single Chip Cryptographic Solution (U)", Military Embedded Systems, OpenSystems Publishing, Jun. 29, 1905 00:00:00.0.

Quintana, Paul, "ESC-443: Fail-Safe FPGA Design Features for High-Reliability Systems", Altera Corporation, San Jose, CA, Jul. 1, 1905 00:00:00.0.

Yang, Z R., "Fault Detection and Classification in Analogue Integrated Circuits using Robust Heteroscedastic Probabilistic Neural Networks", [Online]. Retrieved from the Internet: <http://eprints.soton.ac.uk/251851/1/cafs_c_1.pdf>.

Yu, Changhong, "An On-Chip Clock Jitter Fault Detection Circuit for System-on-Chip Application", International Journal of Advancements in Computing Technology, vol. 3, No. 2, [Online]. Retrieved from the Internet: < 'http://www.aicit.org/ijact/ppl/18-IJACT7-296014.pdf >, Mar. 1, 2011 00:00:00.0.

* cited by examiner

METHODS AND APPARATUS FOR AUTOMATIC FAULT DETECTION

CROSS-REFERENCE TO RELATED APPLICATIONS

This application is a continuation of U.S. patent application Ser. No. 13/405,781, filed Feb. 27, 2012 and entitled, "METHODS AND APPARATUS FOR AUTOMATIC FAULT DETECTION," the entirety of which is incorporated by reference for all purposes.

FIELD OF THE INVENTION

The present disclosure generally relates to mechanisms for automatic fault detection.

BACKGROUND

A variety of systems and applications have high assurance specifications. For example, the Fail Safe Design Assurance (FSDA) specifications require that a single fault, such as an electrical open or short, not cause more than one region of device to malfunction in an undetected manner. Many existing solutions for meeting high assurance specifications involve using physically separate devices to provide isolation of functionality. In a conventional system, multiple devices having the same configuration and performing the same operations may provide outputs that are compared. If the outputs do not match, a fault is determined to have occurred.

However, using separate devices performing the same operations to determine whether a fault has occurred is inefficient in terms of system size, power consumption, weight, and cost. Single device solutions are limited, and do not sufficiently provide high assurance for signal lines. Single device solutions are also inefficient in terms of device size and power consumption.

OVERVIEW

Techniques and mechanisms are provided to monitor signals including critical signals at the endpoints, or leaves, of one or more signal trees in an integrated circuit device. Sensors or layers of sensors may be configured in fault detection circuitry to monitor signals and compare them to static or dynamically varying values. The fault detection circuits may include OR-gate daisy chains that output a fault detection signal to control circuitry if any signal at a particular leaf deviates from an expected signal value. Fault detection circuits may also be configured to identify instances where two or more or N or more signals deviate from an expected signal value. Mechanisms may also be provided to assure the reliability of fault detection circuitry itself.

BRIEF DESCRIPTION OF THE DRAWINGS

Various embodiments may best be understood by reference to the following description taken in conjunction with the accompanying drawings, which illustrate specific embodiments of the present invention.

DETAILED DESCRIPTION

Figure 1:
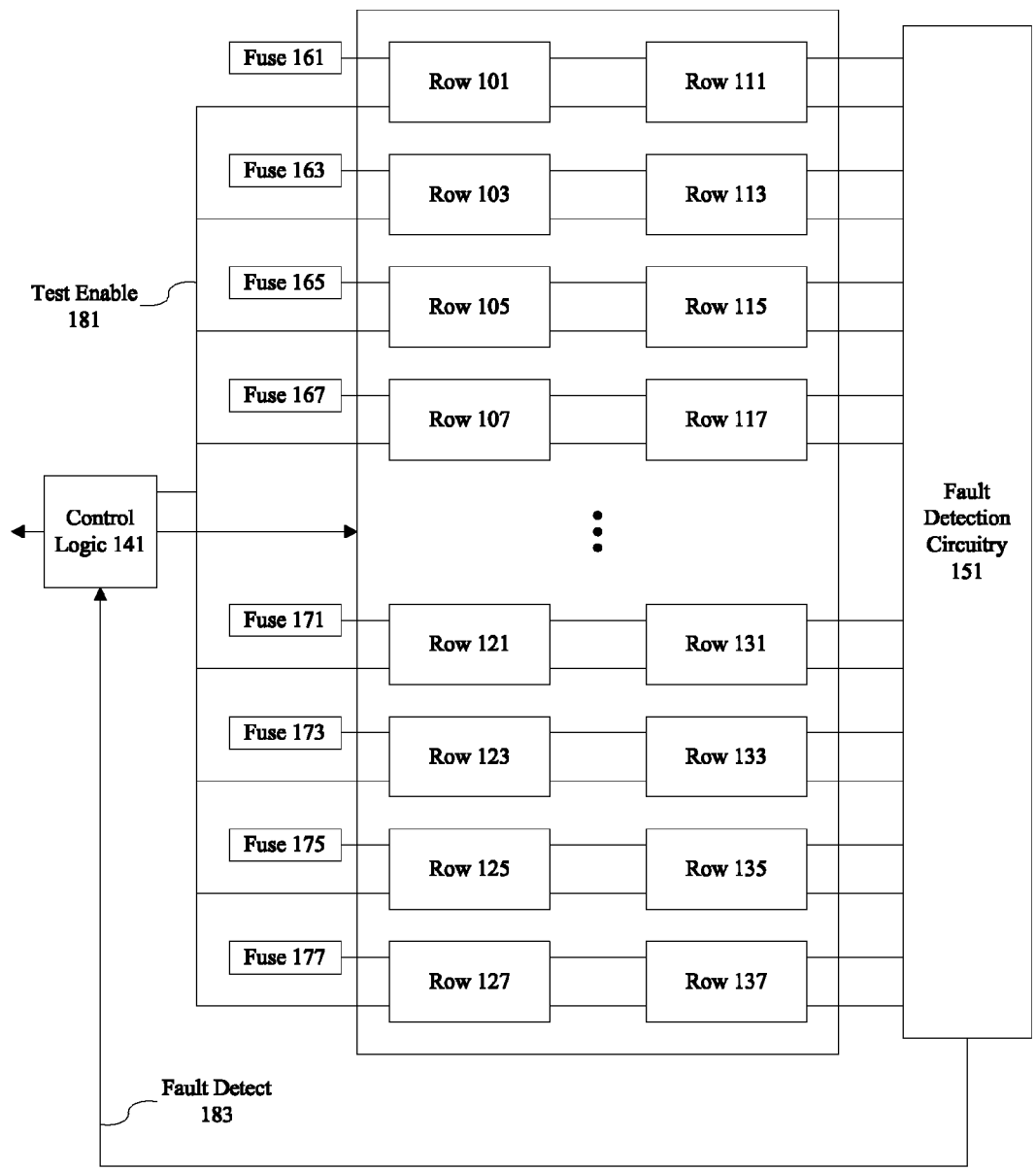
FIG. 1 illustrates one example of control circuitry and fault detection circuitry according to one embodiment of the present invention.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the apparatus and techniques of the present invention will be described in the context of particular signals and particular devices. However, it should be noted that the techniques of the present invention can be applied to a variety of signals and devices such as programmable chips, application specific integrated circuits (ASICs), general purpose processors, controllers, application specific standard products (ASSPs), etc. In the following description, numerous specific details are set forth in order to provide a thorough understanding of the present invention. The present invention may be practiced without some or all of these specific details. In other instances, well known process operations have not been described in detail in order not to unnecessarily obscure the present invention. For instance, the terms encryption and decryption are used throughout this disclosure for clarity depending on context. However, aspects of the invention are not limited to one or the other. Techniques of the invention may be applied to circuits performing either type of operation or any other cryptographic functions.

Various techniques and mechanisms of the present invention will sometimes be described in singular form for clarity. However, it should be noted that some embodiments include multiple iterations of a technique or multiple instantiations of a mechanism unless noted otherwise. For example, a processor is used in a variety of contexts. However, it will be appreciated that multiple processors can also be used while remaining within the scope of the present invention unless otherwise noted. Furthermore, the techniques and mechanisms of the present invention will sometimes describe two entities as being connected. It should be noted that a connection between two entities does not necessarily mean a direct, unimpeded connection, as a variety of other entities may reside between the two entities. For example, a processor may be coupled or connected to memory, but it will be appreciated that a variety of bridges and controllers may reside between the processor and memory. Consequently, a connection or coupling does not necessarily mean a direct, unimpeded connection unless otherwise noted.

Many systems and applications have high assurance requirements. Conventional systems for providing high assurance typically involve redundant devices that provide outputs for comparison. If the outputs do not match, a fault is triggered. A fault handling procedure such as fault notification, device shutdown, deletion of cryptographic material, restoration of the device to a factory state, etc., may be implemented upon detecting the fault. However, redundant devices are inefficient in terms of power consumption, size, weight, complexity, etc. Consequently, the techniques and mechanisms of the present invention provide circuitry for monitoring integrated circuit device signals.

Some signals include global signals, test enable signals on integrated circuit devices, configuration address and data signals for programmable chips, redundancy control lines that initiate operation of redundant logic, etc. Often, these signals may be critical signals that are not part of a signal tree of a user design, making it difficult or impossible for the user to detect failure of these critical signals. Any signal where a single fault affecting the signal can adversely impact operation of a device is referred to herein as a critical signal. Various signals may be driven or may simply float to the wrong state at the wrong time and lead to device malfunction. For example, an electrical short or an electrical open may adversely impact operation of a logic block if the electrical short or the electrical open affects configuration of the circuitry such as a logic block.

According to various embodiments, signals may span out into signal trees that include columns, rows, grids, fabrics, etc., or portions of columns, rows, grids, fabrics, etc. These signal trees terminate at signal endpoints referred to herein as leaves. These signals trees may or may not include buffers along various branches. The leaves may be dynamically driven to a particular state by a signal driver. Faults may impact individual leaves, or branches involving multiple leaves of a signal tree.

According to various embodiments, sensors monitor individual leaves of one or more signal trees. The sensors are included in fault detection circuitry. In particular embodiments, the fault detection circuitry includes OR gates placed along the edge of a device. These OR gates may be daisy-chained such that if any input of any OR gate is asserted, then the output of the daisy-chain will be asserted. Although a daisy chain of OR gates may be a particularly efficient mechanism used in fault detection circuitry, it should be noted that fault detection circuitry may alternatively use AND gates, NAND gates, XOR gates, n-input AND gates, or combinations of a variety of logic gates. For example, fault detection circuitry for expected active high signals would output a fault signal if any of the active high signals were low. Values of each of these expected active high signals could be provided to an n-input AND gate and an output would be a fault value if the value of the AND operation is FALSE. In particular embodiments, a fault signal output by fault detection circuitry may be active high or active low. According to various embodiments, sensors are placed not just along the edge of an integrated circuit device, but may also be placed in the core of a device if some signal lines terminate inside the core of the device.

Expected signal values at the leaves of a signal tree may be static high, static low, or dynamically varying depending on the state of a signal driver. For example, during a test mode, one or more test signals may be asserted. On device reset, a global reset signal may be asserted while all other control signals are deasserted. During normal operation, the clear lines and all of the address lines would be deasserted, but one or more redundancy lines may be asserted. In instances where an expected value at the leaf of a control signal tree is static, the signal value at the particular leaf may be compared, using a comparator such as an XOR gate, to a static value maintained in a memory component, a fuse, configuration random access memory (CRAM), or similar mechanism. In other instances, the signal value at a particular leaf may be compared to a value provided by control logic or user logic. The value provided by control logic or user logic may be dependent on a particular state of the device.

According to various embodiments, fault detection circuitry monitors circumstances where two or more N or more leaves deviate from an expected value. For example, during device initialization, it may be expected that all address lines are deasserted except the one being programmed. A fault may only be triggered if two address lines simultaneously deviate from a deasserted value. Different groups of sensors can be used to monitor different groups of signals. In particular embodiments, control logic can also drive a signal provided to fault detection circuitry to monitor the output of the fault detection circuitry and to determine if fault detection circuitry itself is functioning properly.

According to various embodiments, if a fault is detected by fault detection circuitry, a fault detect signal is generated and sent to control logic. Control logic can implement a variety of fault handling procedures such as sending a notification to user logic, shutting down a device, restoring a device to a factory mode of operation, asserting a failure signal on a device external pin, resetting a device, deleting cryptographic keys or data, etc.

FIG. 1 illustrates a device that can perform automatic fault detection according to one embodiment of the present invention. According to various embodiments, the device includes control logic 141 that sends a signal to a signal tree. In particular embodiments, the control logic 141 sends a test enable signal on test enable line 181 to a signal tree including multiple rows of logic, such as rows of logic in a programmable chip. Although a test enable signal on a test enable line 181 is shown, it should be noted that a variety of signals such as configuration address and data signals can also be sent. The rows of logic include rows 101, 103, 105, 107, 111, 113, 115, 117, 121, 123, 125, 127, 131, 133, 135, and 137.

According to various embodiments, fault detection circuitry 151 is connected to endpoints of each of the rows of logic to allow fault detection circuitry 151 to monitor signals at the ends of the wires farthest from signal sources, so that any fault that occurs along the length of the wire may be detected, even if there are intervening buffers. Fault detection circuitry 151 can be used to monitor a variety of signal trees at the leaves of the signals trees. According to various embodiments, each of the rows of logic may be controlled by fuses 161, 163, 165, 167, 171, 173, 175, and 177 that feed each row. In particular embodiments, these fuses may provide redundancy signals indicating whether redundancy is active for a particular row of logic. According to various embodiments, these redundancy signals may also be monitored by fault detection circuitry. Fault detection circuitry 151 may send one or more fault detect signals on fault detect line 183 to control logic 141 upon detecting a fault.

Figure 2:
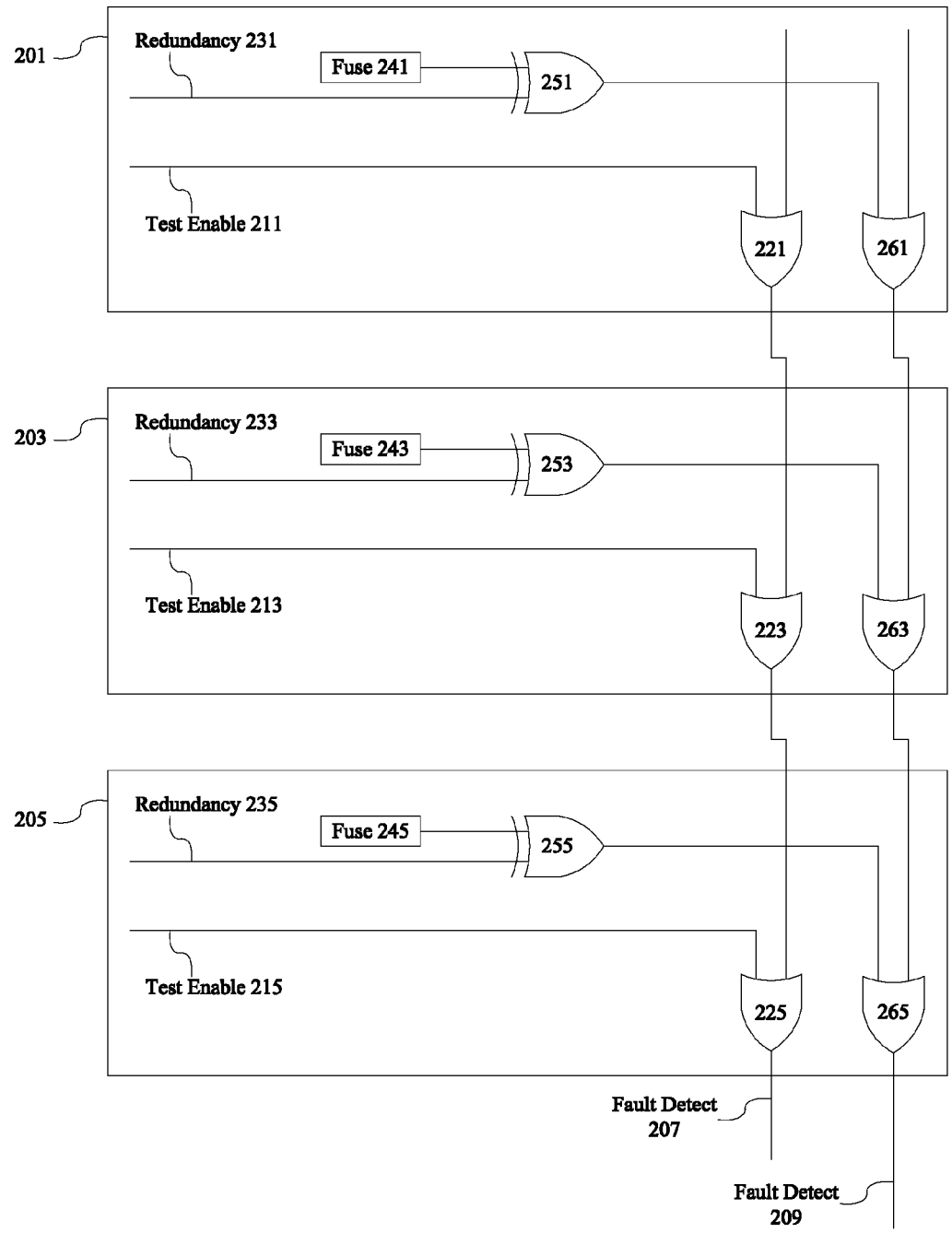
FIG. 2 illustrates one example of fault detection circuitry monitoring multiple signals in accordance to one embodiment of the present invention.

FIG. 2 illustrates one example of fault detection circuitry according to one embodiment of the present invention. According to various embodiments, fault detection circuitry spans three rows 201, 203, and 205. Test enable lines 211, 213, and 215 may be connected as inputs to OR gates 221, 223, and 225. If any test enable signal is asserted on lines 211, 213, or 215, the fault detect signal on line 207 is asserted. Redundancy lines 231, 233, and 235 are connected as inputs to XOR gates 251, 253, and 255. Also connected to inputs of XOR gates 251, 253, and 255 are fuses 241, 243, and 245. Redundancy signals on redundancy lines 231, 233, and 235 are compared to the values maintained in fuses 241, 243, and 245 respectively. If any of the redundancy signals on the redundancy lines 231, 233, and 235 deviate from expected values maintained in fuses 241, 243, and 245, an input to OR gate 251, 253, or 265 is asserted and a fault detect signal on line 209 is asserted.

Fault detection circuitry can be used to monitor a variety of signals and their associated signal trees and can provide one or more fault detect signals. According to various embodiments, fault detection circuitry outputs only one fault detect signal as any fault in a device should cause the shutdown of the device. In other examples, fault detection circuitry outputs multiple different fault detect signals so that information about the fault can be better determined. In particular embodiments, the time it takes for fault detection circuitry to detect a fault can be reduced by using several layers of sensors, where each sensor in a first layer detects a fault in a subset of the control signals, and the outputs of each sensor in this first layer of sensors is monitored by one or more sensors in a second layer of sensors. The second layer of sensors can output an asserted fault signal if any of the sensors in the first layer of sensors outputs an asserted fault signal. In some examples, numerous layers can be used so that multiple layers of sensors could be used to monitor a single set of control signals.

Figure 3:
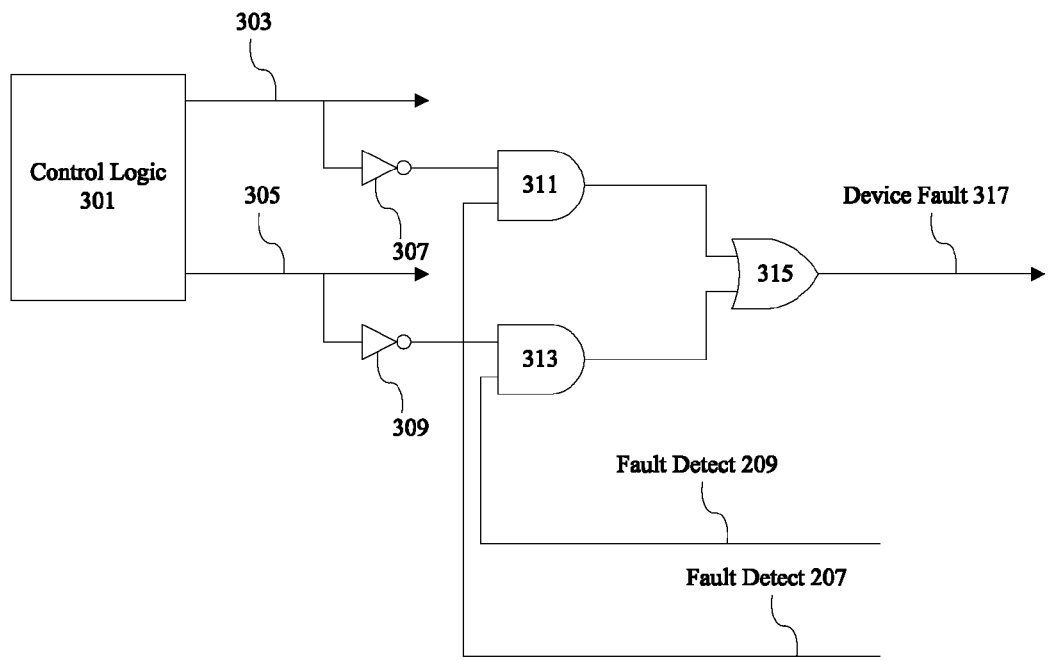
FIG. 3 illustrates one example of fault detection circuitry masking in accordance to one embodiment of the present invention.

According to various embodiments, fault detection circuitry may also use fault masking. FIG. 3 illustrates one example of fault detection circuitry using masking. According to various embodiments, a fault detect signal on fault detect line 207 is provided as shown in FIG. 2 if a test enable signal is asserted. If the control logic 301 is actually generating a test enable signal and a detected test enable signal is not merely a fault, the fault detect signal on fault detect line 207 will be masked by the AND gate 311. That is, if control logic 301 is asserting a test enable signal on test enable line 303, the signal is inverted at NOT gate 307 and used to mask the fault detect signal on fault detect line 207 at AND gate 311.

Similarly, if the control logic 301 determines that redundancy is enabled, the fault detect signal on fault detect line 209 provided as shown in FIG. 2 will be masked by AND gate 313. That is, if control logic 301 asserts a redundancy enable signal on redundancy enable line 305, the redundancy enable signal is inverted at NOT gate 309 and used to mask fault detect signal on fault detect line 209 at AND gate 313. The outputs of AND gates 311 and 313 can be provided as inputs to OR gate 315 to send a device fault signal on device fault line 317 if any unmasked fault is detected.

According to various embodiments, control logic may mask any of the fault sensors to ignore them. Fault sensors can be ignored using fixed values according to one or more programmable values maintained in CRAMS, fuses, etc. In other examples, fault sensors can be ignored by masking using a dynamically varying signal value provided by control logic or user logic. In particular embodiments, the detection of the assertion of one or more clear wires can be ignored when the control logic is initializing a device. Similarly, the detection of one or more address line assertions can be ignored during the time a device is being configured. Fault sensors can also be ignored by masking using values output by user logic or values used as input to user logic in a user design. According to various embodiments, control logic may also send a signal directly to fault detection circuitry and identify an output to determine if sensors are operating properly.

Figure 4:
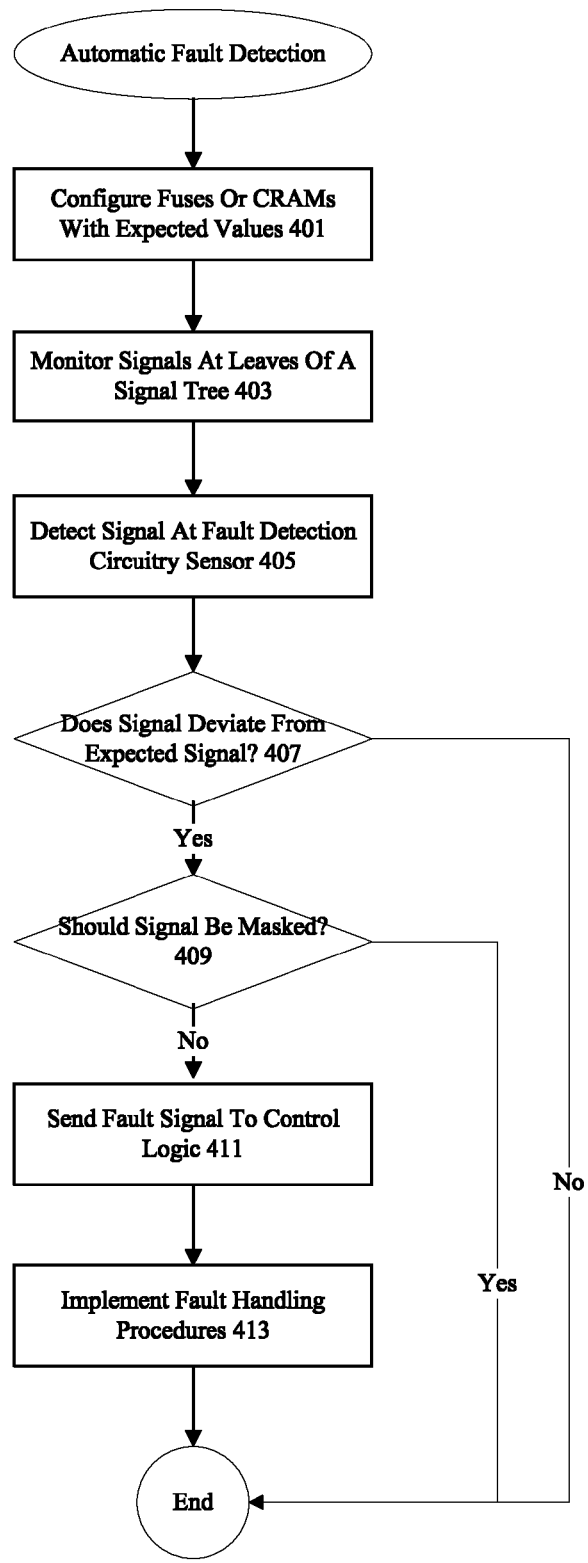
FIG. 4 illustrates an exemplary technique for performing automatic fault monitoring in accordance to one embodiment of the present invention.

FIG. 4 illustrates a technique for implementing fault monitoring. According to various embodiments, mechanisms such as fuses and CRAMs are configured with expected values for signals at 401. The signal may be a global or critical signal such as a test enable signal, redundancy enable signal, address and data configuration signal, etc. In particular embodiments, the expected value of an address and data configuration signal should be 0 for all lines during operation mode and should be 0 for all lines except one line during configuration mode.

In particular embodiments, signals are monitored at the leaves of a signal tree at 403 lines are asserted simultaneously during configuration. In particular embodiments, the logic is as follows:

TWO_OR_MORE_FAULTS[N+1]=(TWO_OR_
MORE_FAULTS[N] or ONE_OR_MORE_
FAULTS[N] and FAULT_ASSERTED[N+1]);     (Equation 1)

where N is the row number or position in the daisy chain.

Monitoring signals at the leaves of a signal tree allow detection of faults at any point along the branches of a signal tree. The signal tree may include wire interconnections, rows, columns, grids, matrices, or portions thereof. At 405, a signal may be detected at a fault detection circuitry sensor. According to various embodiments, the fault detection circuitry sensor may be an OR gate connected in a daisy chain of OR gates. The signal may be compared to a reference signal to determine if it deviates from the expected signal value at 407. According to various embodiments, the expected value is a static value provided by a fuse or CRAM. In other examples, the expected value is a static or dynamic value provided by control logic or user logic or even an external source. If the signal does not deviate from an expected value at 407, monitoring can continue but in this example monitoring is terminated. If the signal does deviate from an expected value at 407, it is determined if any associated signal should be masked at 409. In some examples, the fault detect signal should be masked because fault detection circuitry expects to have a certain number of signals that deviate from a particular value during certain modes of operation. For example, during a device programming mode, it may be expected that one or possibly more configuration signals deviate from an expected signal. According to various embodiments, fault detection circuitry may only send a fault signal to control logic 411 if a particular number of perceived faults is detected. Fault handling procedures can then be implemented at 413. Fault handling procedures may include device shutdown, device reset, deletion of cryptographic keys, deletion of data, etc.

Figure 5:
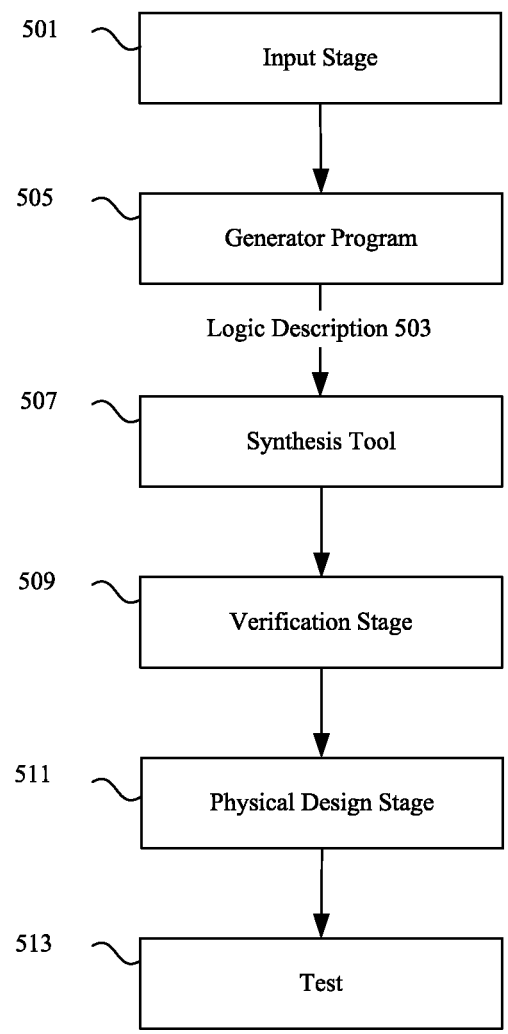
FIG. 5 illustrates an exemplary technique for implementing a programmable chip in accordance to one embodiment of the present invention.

Although the techniques and mechanisms of the present invention can be used on a variety of devices such as ASICs, ASSPs, controllers, processors, etc., one particular example of a device that can use automatic fault monitoring is a programmable chip. Programmable chips have a number of global signals critical to device operation that are completely outside of a user design and consequently difficult for a user to monitor and detect faults. FIG. 5 is a diagrammatic representation showing implementation of a programmable chip. An input stage 501 receives selection information typically from a user for logic to be implemented on an electronic device. In one example, the input received is in the form of a high-level language program. A generator program 505 creates a logic description and provides the logic description 503 along with other customized logic to any of a variety of synthesis tools, place and route programs, and logic configuration tools to allow a logic description to be implemented on an electronic device.

In one example, an input stage 501 often allows selection and parameterization of components to be used on an electronic device. The input stage 501 also allows configuration of hard coded logic. In some examples, components provided to an input stage include prepackaged logic such as intellectual property functions, megafunctions, and intellectual property cores. The input stage 501 may be a graphical user interface using wizards for allowing efficient or convenient entry of information. The input stage may also be a text interface or a program reading a data file such as a spreadsheet, database table, or schematic to acquire selection information. The input stage 501 produces an output containing information about the various modules selected. At this stage, the user may enter security information about individual components that needs to be isolated. For example, different levels of component security and which components are allowed to communicate with each other may be entered.

In typical implementations, the generator program 505 can identify the selections and generate a logic description 503 with information for implementing the various modules. The generator program 505 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 505 identifies pointers and provides ports for each pointer. One tool with generator program capabilities is System on a Programmable Chip (SOPC) Builder available from Altera Corporation of San Jose, Calif. The generator program 505 also provides information to a synthesis tool 507 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool at a verification stage 509.

As will be appreciated by one of skill in the art, the input stage 501, generator program 505, and synthesis tool 507 can be separate programs. The interface between the separate programs can be a database file, a log, or simply messages transmitted between the programs. For example, instead of writing a file to storage, the input stage 501 can send messages directly to the generator program 505 to allow the generator program to create a logic description. Similarly, the generator program can provide information directly to the synthesis tool instead of writing HDL files. Similarly, input stage 501, generator program 505, and synthesis tool 507 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 507.

A synthesis tool 507 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 509 typically follows the synthesis stage 507. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 509, the synthesized netlist file can be provided to physical design tools 511 including place and route and configuration tools. A place and route tool locates logic cells on specific logic elements of a target hardware device and connects wires between the inputs and outputs of the various logic elements in accordance with logic and security provided to implement an electronic design. According to various embodiments of the present invention, the place and route tool may perform the techniques of the present invention to implement the various security requirements and rules as defined by the user. The iterative technique may be transparent to the user, but the resulting device can be physically tested at 513.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be used using various techniques of the present invention.

As noted above, different stages and programs can be integrated in a variety of manners. According to one embodiment, the input stage 501, the generator program 505, the synthesis tool 507, the verification tools 509, and physical design tools 511 are integrated into a single program. The various stages are automatically run and transparent to a user. The program can receive the user-selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 6:
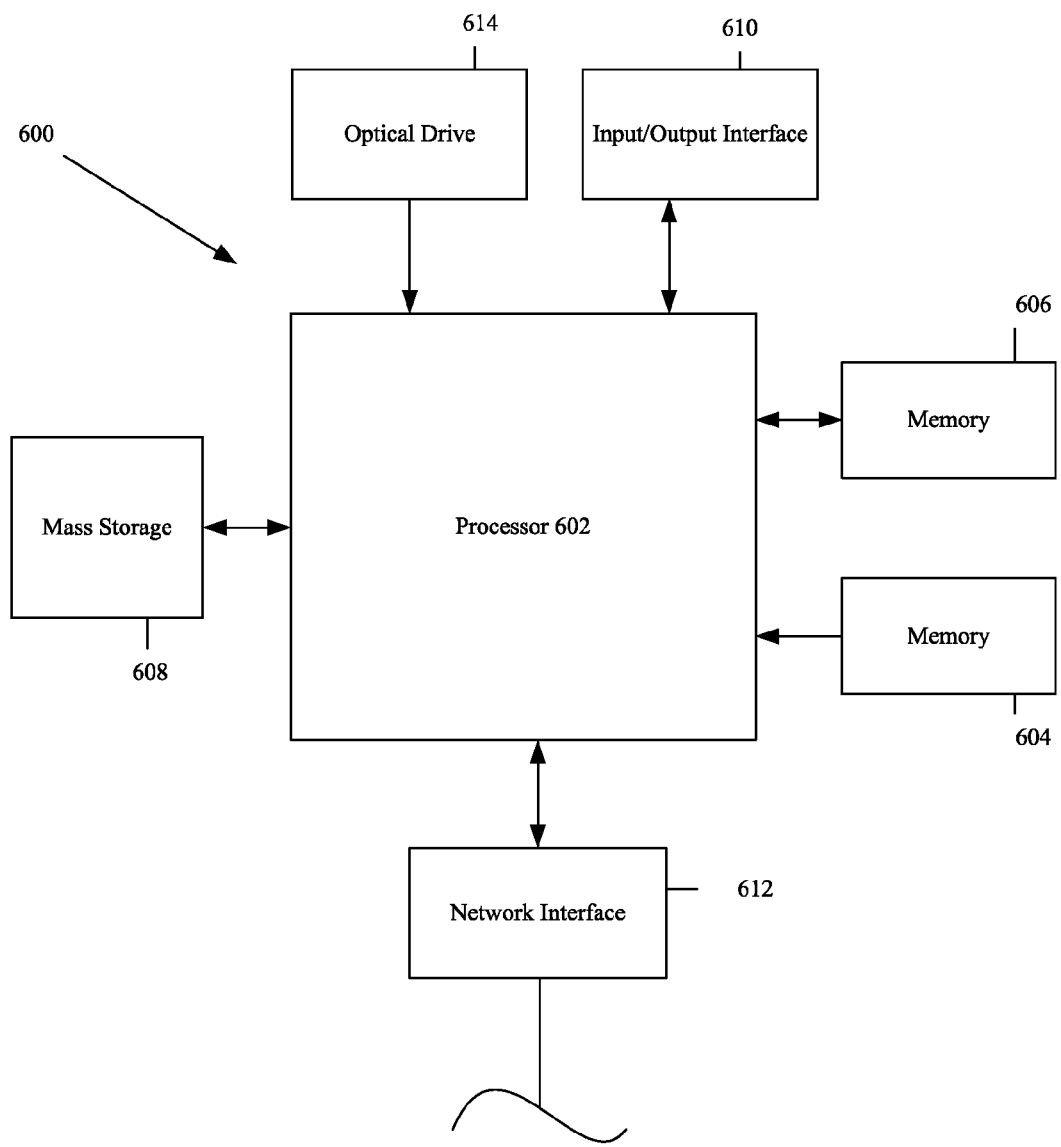
FIG. 6 illustrates one example of a system for implementing a programmable chip.

FIG. 6 is a diagrammatic representation showing a typical computer system that can be used to implement a device. The computer system includes any number of processors 602 (also referred to as central processing units, or CPUs) that are coupled to devices including memory 606 (typically a random access memory, or "RAM"), memory 604 (typically a read only memory, or "ROM"). The processors 602 can be configured to generate an electronic design. As is well known in the art, memory 604 acts to transfer data and instructions uni-directionally to the CPU and memory 606 are used typically to transfer data and instructions in a bi-directional manner.

Both of these memory devices may include any suitable type of the computer-readable media described above. A mass storage device 608 is also coupled bi-directionally to CPU 602 and provides additional data storage capacity and may include any of the computer-readable media described above. The mass storage device 608 may be used to store programs, data and the like and is typically a secondary storage medium such as a hard disk that is slower than memory. The mass storage device 608 can be used to hold a library or database of prepackaged logic or intellectual property functions, as well as information on generating particular configurations. It will be appreciated that the information retained within the mass storage device 608, may, in appropriate cases, be incorporated in standard fashion as part of memory 606 as virtual memory. A specific mass storage device such as an optical drive 614 may also pass data uni-directionally to the CPU.

CPU 602 is also coupled to an interface 610 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 602 may be a design tool processor. Finally, CPU 602 optionally may be coupled to a computer or telecommunications network using a network interface as shown generally at 612. With such a network connection, it is contemplated that the CPU might receive information from the network, or might output information to the network in the course of performing the above-described process steps. It should be noted that the system 800 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes can also be used to practice the techniques of the present invention.

While particular embodiments of the invention have been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. An integrated circuit device comprising:
   control logic configured to send a signal onto a signal tree included on the integrated circuit device, the signal tree comprising branches and leaves, wherein the branches and leaves include columns and rows of circuit lines configured to carry signals from a signal source to signal endpoints, wherein each leaf of the signal tree comprises a signal endpoint; and
   fault detection circuitry on the integrated circuit device configured to monitor, using sensors, a plurality of signal values at each of the leaves on the signal tree such that the fault detection circuitry can detect faults at any point along the branches of the signal tree, the fault detection circuitry being further configured to generate a fault detect signal,
   wherein the control logic is further configured to mask the fault detect signal upon determining that the fault detect signal should be masked.

2. The integrated circuit device of claim 1, wherein the control logic implements a fault handling procedure upon receiving the fault detect signal, the fault handling procedure comprising resetting the device.

3. The integrated circuit device of claim 1, wherein the control logic implements a fault handling procedure upon receiving the fault detect signal, the fault handling procedure comprising deleting cryptographic keys.

4. The integrated circuit device of claim 1, wherein the signal is a test enable signal.

5. The integrated circuit device of claim 1, wherein the signal is an address and data configuration signal.

6. The integrated circuit device of claim 1, wherein an expected value used for generating the fault detect signal is maintained in a fuse or configuration random access memory (CRAM).

7. The integrated circuit device of claim 1, wherein an expected value used for generating the fault detect signal is a variable and is provided by the control logic.

8. The integrated circuit device of claim 1, wherein an expected value used for generating the fault detect signal is a variable and is provided by user logic.

9. The integrated circuit device of claim 1, wherein the fault detection circuitry comprises a daisy chain of OR gates.

10. The integrated circuit device of claim 9, wherein the fault detection circuitry comprises layers of a plurality of sensors.

11. A method comprising:
    monitoring a plurality of signals at a plurality of leaves corresponding to a plurality of signal trees on an integrated circuit device, the plurality of signal trees comprising branches and leaves, wherein the branches and leaves include columns and rows of circuit lines configured to carry signals from a signal source to signal endpoints, wherein each leaf of a signal tree in the plurality of signal trees comprises a signal endpoint, such that fault detection circuitry included on the integrated circuit device can detect faults at any point along the branches of a signal tree in the plurality of signal trees using sensors that monitor each of the leaves in the plurality of signal trees;
    generating a fault detect signal;
    determining whether the fault detect signal should be masked; and
    masking the fault detect signal upon determining that the fault detect signal should be masked.

12. The method of claim 11, further including implementing a fault handling procedure comprising resetting the device.

13. The method of claim 11, further including implementing a fault handling procedure comprising deleting cryptographic keys.

14. The method of claim 11, wherein the plurality of signals includes a test enable signal.

15. The method of claim 11, wherein the plurality of signals includes an address and data configuration signal.

16. The method of claim 11, wherein an expected value used for generating the fault detect signal is maintained in a fuse or configuration random access memory (CRAM).

17. The method of claim 11, wherein an expected value used for generating the fault detect signal is a variable provided by control logic.

18. The method of claim 11, wherein an expected value used for generating the fault detect signal is a variable provided by user logic.

19. The method of claim 11, wherein the fault detection circuitry comprises a daisy chain of OR gates.

20. A system, comprising:
   a processor;
   memory coupled to the processor;
   an integrated circuit device including:
      control logic configured to send a signal onto a signal tree included on the integrated circuit device, the signal tree comprising branches and leaves, wherein the branches and leaves include columns and rows of circuit lines configured to carry signals from a signal source to signal endpoints, wherein each leaf of the signal tree comprises a signal endpoint; and
      fault detection circuitry on the integrated circuit device configured to monitor, using sensors, a plurality of signal values at each of the leaves on the signal tree such that the fault detection circuitry can detect faults at any point along the branches of the signal tree, the fault detection circuitry being further configured to generate a fault detect signal,
         wherein the control logic is further configured to mask the fault detect signal upon determining that the fault detect signal should be masked.

* * * * *